US009831843B1

(12) United States Patent
Das et al.

(10) Patent No.: US 9,831,843 B1

(45) Date of Patent: Nov. 28, 2017

(54) OPPORTUNISTIC PLAYBACK STATE CHANGES FOR AUDIO DEVICES

(71) Applicant: Cirrus Logic, Inc., Austin, TX (US)

(72) Inventors: Tejasvi Das, Austin, TX (US); Bharath Kumar Thandri, Austin, TX (US); Anand Ilango, Austin, TX (US); Aniruddha Satoskar, Austin, TX (US); Daniel John Allen, Austin, TX (US); Xiaofan Fei, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 159 days.

(21) Appl. No.: 14/204,793

(22) Filed: Mar. 11, 2014

Related U.S. Application Data

(63) Continuation-in-part of application No. 14/083,972, filed on Nov. 19, 2013.

(Continued)

(51) Int. Cl.
*H04R 5/00* (2006.01)
*H03G 3/20* (2006.01)

(52) U.S. Cl.
CPC .................................... *H03G 3/20* (2013.01)

(58) Field of Classification Search
None
See application file for complete search history.

(56) References Cited

U.S. PATENT DOCUMENTS 4,446,440 A 5/1984 Bell
4,493,091 A 1/1985 Gundry (Continued)

FOREIGN PATENT DOCUMENTS

EP 0966105 A2 12/1999
EP 1575164 A2 9/2005

(Continued)

OTHER PUBLICATIONS

International Search Report and Written Opinion, International Application No. PCT/US2015/056357, dated Jan. 29, 2015, 13 pages.

(Continued)

*Primary Examiner* — Joseph Saunders, Jr.
*Assistant Examiner* — James Mooney
(74) *Attorney, Agent, or Firm* — Jackson Walker L.L.P.

(57) ABSTRACT

An audio playback path of an audio apparatus includes a digital modulator, a digital-to-analog converter (DAC), and a power amplifier. The digital modulator receives a playback signal corresponding to playback audio content and generates a digital input signal in accordance with the playback signal. The DAC receives the audio input signal and generates an analog preamplifier signal. The power amplifier generates an audio output signal in accordance with the preamplifier signal and an analog attenuation determined by the analog attenuation signal. The apparatus may include a volume control input to receive a volume control signal and a playback controller configured to perform operations including generating an analog attenuation signal in accordance with the volume control signal, monitoring a playback state indicated by the playback parameters, and responsive to detecting the playback state satisfying the playback criterion, modifying a selected playback parameter to improve a performance parameter of the playback path.

47 Claims, 6 Drawing Sheets

5B
5A
3
4
1
8
2
AUDIO IC 9
6A
6B
PROCESSOR 7
MEMORY 10
11A
11B

Related U.S. Application Data

(60) Provisional application No. 61/874,014, filed on Sep. 5, 2013.

(56) References Cited

U.S. PATENT DOCUMENTS 4,890,107 A 12/1989 Pearce
4,972,436 A 11/1990 Halim et al.
4,999,628 A 3/1991 Kakubo et al.
4,999,830 A 3/1991 Agazzi
5,077,539 A 12/1991 Howatt
5,148,167 A 9/1992 Ribner
5,198,814 A 3/1993 Ogawara et al.
5,321,758 A 6/1994 Charpentier et al.
5,323,159 A 6/1994 Imamura et al.
5,343,161 A 8/1994 Tokumo et al.
5,550,923 A 8/1996 Hotvet et al.
5,600,317 A 2/1997 Knoth et al.
5,714,956 A 2/1998 Jahne et al.
5,719,641 A 2/1998 Mizoguchi
5,745,355 A 4/1998 Tracy et al.
5,808,575 A 9/1998 Himeno et al.
5,810,477 A 9/1998 Abraham et al.
6,088,461 A 7/2000 Lin et al.
6,201,490 B1 3/2001 Kawano et al.
6,271,780 B1 8/2001 Gong et al.
6,333,707 B1 12/2001 Oberhammer et al.
6,353,404 B1 3/2002 Kuroiwa
6,542,612 B1 4/2003 Needham
6,683,494 B2 1/2004 Stanley
6,768,443 B2 7/2004 Willis
6,822,595 B1 11/2004 Robinson
6,853,242 B2 2/2005 Melanson et al.
6,888,888 B1 5/2005 Tu et al.
6,897,794 B2 5/2005 Kuyel et al.
7,020,892 B2 3/2006 Levesque et al.
7,023,268 B1 4/2006 Taylor et al.
7,061,312 B2 6/2006 Andersen et al.
7,167,112 B2 1/2007 Andersen et al.
7,216,249 B2 5/2007 Fujiwara et al.
7,279,964 B2 10/2007 Bolz et al.
7,302,354 B2 11/2007 Zhuge
7,312,734 B2 12/2007 McNeill et al.
7,315,204 B2 1/2008 Seven
7,365,664 B2 4/2008 Caduff et al.
7,403,010 B1 7/2008 Hertz
7,440,891 B1 10/2008 Shozakai et al.
7,522,677 B2 4/2009 Liang
7,583,215 B2 9/2009 Yamamoto et al.
7,671,768 B2 3/2010 De Ceuninck
7,679,538 B2 3/2010 Tsang
7,893,856 B2 2/2011 Ek et al.
8,060,663 B2 11/2011 Murray et al.
8,130,126 B2 3/2012 Breitschaedel et al.
8,289,425 B2 10/2012 Kanbe
8,330,631 B2 12/2012 Kumar et al.
8,362,936 B2 1/2013 Ledzius et al.
8,462,035 B2 6/2013 Schimper et al.
8,483,753 B2 7/2013 Behzad et al.
8,508,397 B2 8/2013 Hisch
8,717,211 B2 5/2014 Miao et al.
8,786,477 B1 7/2014 Albinet
8,836,551 B2 9/2014 Nozaki
8,873,182 B2 10/2014 Liao et al.
8,878,708 B1 11/2014 Sanders et al.
8,952,837 B2 2/2015 Kim et al.
9,071,267 B1 6/2015 Schneider et al.
9,071,268 B1 6/2015 Schneider et al.
9,118,401 B1 8/2015 Nieto et al.
9,148,164 B1 9/2015 Schneider et al.
9,171,552 B1 10/2015 Yang
9,210,506 B1 12/2015 Nawfal et al.
9,306,588 B2 4/2016 Das et al.
9,337,795 B2 5/2016 Das et al.
9,391,576 B1 7/2016 Satoskar et al.
9,503,027 B2 11/2016 Zanbaghi
9,525,940 B1 12/2016 Schneider et al.
9,543,975 B1 1/2017 Melanson et al.
9,584,911 B2 2/2017 Das et al.
9,596,537 B2 3/2017 He et al.
9,635,310 B2 4/2017 Chang et al.
2001/0001547 A1 5/2001 Delano et al.
2001/0009565 A1 7/2001 Singvall
2004/0078200 A1 4/2004 Alves
2004/0184621 A1 9/2004 Andersen et al.
2005/0258989 A1 11/2005 Li et al.
2005/0276359 A1 12/2005 Xiong
2006/0056491 A1 3/2006 Lim et al.
2006/0064037 A1 3/2006 Shalon et al.
2006/0098827 A1 5/2006 Paddock et al.
2006/0284675 A1 12/2006 Krochmal et al.
2007/0026837 A1 2/2007 Bagchi
2007/0057720 A1 3/2007 Hand et al.
2007/0092089 A1 4/2007 Seefeldt et al.
2007/0103355 A1 5/2007 Yamada
2007/0120721 A1 5/2007 Caduff et al.
2007/0123184 A1 5/2007 Nesimoglu et al.
2008/0030577 A1 2/2008 Cleary et al.
2008/0114239 A1 5/2008 Randall et al.
2008/0143436 A1 6/2008 Xu
2008/0159444 A1 7/2008 Terada
2008/0198048 A1 8/2008 Klein et al.
2008/0292107 A1 11/2008 Bizjak
2009/0021643 A1 1/2009 Hsueh et al.
2009/0058531 A1 3/2009 Hwang et al.
2009/0084586 A1 4/2009 Nielsen
2009/0220110 A1* 9/2009 Bazarjani .............. H03F 1/0211 381/120
2010/0183163 A1 7/2010 Matsui et al.
2011/0013733 A1 1/2011 Martens et al.
2011/0025540 A1 2/2011 Katsis
2011/0029109 A1 2/2011 Thomsen et al.
2011/0063148 A1 3/2011 Kolze et al.
2011/0096370 A1 4/2011 Okamoto
2011/0136455 A1 6/2011 Sundstrom et al.
2011/0150240 A1 6/2011 Akiyama et al.
2011/0170709 A1* 7/2011 Guthrie ................. H03F 3/2175 381/94.2
2011/0188671 A1 8/2011 Anderson et al.
2011/0228952 A1* 9/2011 Lin ...................... H03F 1/0211 381/105
2011/0242614 A1 10/2011 Okada
2011/0268301 A1 11/2011 Nielsen et al.
2011/0285463 A1 11/2011 Walker et al.
2012/0001786 A1 1/2012 Hisch
2012/0047535 A1 2/2012 Bennett et al.
2012/0133411 A1* 5/2012 Miao ...................... H03G 3/001 327/306
2012/0177201 A1 7/2012 Ayling et al.
2012/0177226 A1* 7/2012 Silverstein ............ G06F 1/3212 381/107
2012/0188111 A1* 7/2012 Ledzius .................. H03M 1/70 341/144
2012/0207315 A1 8/2012 Kimura et al.
2012/0242521 A1 9/2012 Kinyua
2012/0250893 A1 10/2012 Carroll et al.
2012/0263090 A1 10/2012 Porat et al.
2012/0280726 A1 11/2012 Colombo et al.
2013/0095870 A1 4/2013 Phillips et al.
2013/0106635 A1 5/2013 Doi
2013/0129117 A1 5/2013 Thomsen et al.
2013/0188808 A1 7/2013 Pereira et al.
2013/0241753 A1 9/2013 Nozaki
2013/0241755 A1 9/2013 Chen et al.
2014/0044280 A1 2/2014 Jiang
2014/0105256 A1 4/2014 Hanevich et al.
2014/0105273 A1 4/2014 Chen et al.
2014/0126747 A1 5/2014 Huang
2014/0135077 A1 5/2014 Leviant et al.
2014/0184332 A1 7/2014 Shi et al.
2014/0269118 A1 9/2014 Taylor et al.
2014/0368364 A1 12/2014 Hsu
2015/0009079 A1 1/2015 Bojer
2015/0170663 A1 6/2015 Disch et al.
2015/0214974 A1 7/2015 Currivan

(56) References Cited

U.S. PATENT DOCUMENTS

| | | | |
|---|---|---|---|
| 2015/0214975 | A1 | 7/2015 | Gomez et al. |
| 2015/0249466 | A1 | 9/2015 | Elyada |
| 2015/0295584 | A1 | 10/2015 | Das et al. |
| 2015/0381130 | A1 | 12/2015 | Das et al. |
| 2016/0072465 | A1 | 3/2016 | Das et al. |
| 2016/0080862 | A1 | 3/2016 | He et al. |
| 2016/0080865 | A1 | 3/2016 | He et al. |
| 2016/0118948 | A1 | 4/2016 | Zanbaghi |
| 2016/0173112 | A1 | 6/2016 | Das et al. |
| 2016/0286310 | A1 | 9/2016 | Das et al. |
| 2016/0365081 | A1 | 12/2016 | Satoskar et al. |
| 2017/0047895 | A1 | 2/2017 | Zanbaghi |
| 2017/0150257 | A1 | 5/2017 | Das et al. |

FOREIGN PATENT DOCUMENTS

| | | | |
|---|---|---|---|
| EP | 1753130 | A1 | 2/2007 |
| EP | 1798852 | A2 | 6/2009 |
| EP | 2207264 | A1 | 7/2010 |
| GB | 1599401 | A | 9/1981 |
| GB | 2119189 | A | 11/1983 |
| GB | 2307121 | A | 6/1997 |
| GB | 2507096 | A | 4/2014 |
| GB | 2527637 | A | 12/2015 |
| GB | 2527677 | B | 10/2016 |
| GB | 2539517 | A | 12/2016 |
| JP | 2008294803 | A | 12/2008 |
| WO | WO0054403 | A1 | 9/2000 |
| WO | WO0237686 | A2 | 5/2002 |
| WO | 2008067260 | A1 | 6/2008 |
| WO | 2014113471 | A1 | 7/2014 |
| WO | 2015160655 | A1 | 10/2015 |
| WO | 2016040165 | A1 | 3/2016 |
| WO | 2016040171 | A1 | 3/2016 |
| WO | 2016040177 | A1 | 3/2016 |
| WO | 2016160336 | A1 | 10/2016 |
| WO | 2016202636 | A1 | 12/2016 |

OTHER PUBLICATIONS

Combined Search and Examination Report, UK Application No. GB1510578.6, dated Aug. 3, 2015, 2015, 3 pages.

Combined Search and Examination Report, UK Application No. GB1514512.1, dated Feb. 11, 2016, 7 pages.

International Search Report and Written Opinion, International Application No. PCT/US2015/048609, dated Mar. 23, 2016, 23 pages.

Thaden, Rainer et al., A Loudspeaker Management System with FIR/IRR Filtering; AES 32nd International Conference, Hillerod, Denmark, Sep. 21-23, 2007; pp. 1-12.

Thaden, Rainer et al., A Loudspeaker Management System with FIR/IRR Filtering; Slides from a presentation given at the 32nd AES conference "DSP for Loudspeakers" in Hillerod, Denmark in Sep. 2007; http://www.four-audio.com/data/AES32/AES32FourAudio.pdf; 23 pages.

GB Patent Application No. 1419651.3, Improved Analogue-to-Digital Convertor, filed Nov. 4, 2014, 65 pages.

Combined Search and Examination Report, GB Application No. GB1506258.1, dated Oct. 21, 2015, 6 pages.

International Search Report and Written Opinion, International Patent Application No. PCT/US2015/025329, dated Aug. 11, 2015, 9 pages.

International Search Report and Written Opinion, International Patent Application No. PCT/US2015/048633, dated Dec. 10, 2015, 11 pages.

International Search Report and Written Opinion, International Patent Application No. PCT/US2015/048591, dated Dec. 10, 2015, 11 pages.

International Search Report and Written Opinion, International Application No. PCT/US2016/022578, dated Jun. 22, 2016, 12 pages.

Combined Search and Examination Report, GB Application No. GB1600528.2, dated Jul. 7, 2016, 8 pages.

Combined Search and Examination Report, GB Application No. GB1603628.7, dated Aug. 24, 2016, 6 pages.

International Search Report and Written Opinion, International Application No. PCT/EP2016/062862, dated Aug. 26, 2016, 14 pages.

Combined Search and Examination Report, GB Application No. GB1602288.1, dated Aug. 9, 2016, 6 pages.

International Search Report and Written Opinion of the International Searching Authority, International Application No. PCT/US2016/065134, dated Mar. 15, 2017.

International Search Report and Written Opinion of the International Searching Authority, International Application No. PCT/US2016/040096, dated Mar. 24, 2017.

International Search Report and Written Opinion of the International Searching Authority, International Application No. PCT/US2017/014240, dated Apr. 24, 2017.

Groeneweg, B.P., et al., A Class-AB/D Audio Power Amplifier for Mobile Applications Integrated Into a 2.5G/3G Baseband Processo1016r, IEEE Transactions on Circuits and Systems—I: Regular Papers, vol. 57, No. 5, May 2010, pp. 1003-.

Chen, K., et al., A High-PSRR Reconfigurable Class-AB/D Audio. Amplifier Driving a Hands-Free/Receiver. 2-in-1 Loudspeaker, IEEE Journal of Solid-State Circuits, vol. 47, No. 11, Nov. 2012, pp. 2586-2603.

Combined Search and Examination Report under Sections 17 and 18(3) of the UKIPO, Application No. GB1620427.3, dated Jun. 1, 2017.

Combined Search and Examination Report under Sections 17 and 18(3) of the UKIPO, Application No. GB1620428.1, dated Jul. 21, 2017.

Combined Search and Examination Report under Sections 17 and 18(3), United Kingdom Intellectual Property Office, Application No. GB1700371.6, dated Aug. 1, 2017.

* cited by examiner

OPPORTUNISTIC PLAYBACK STATE CHANGES FOR AUDIO DEVICES

FIELD OF DISCLOSURE

The present disclosure relates in general to personal audio devices and, more specifically, to systems and methods for managing power consumption and other performance characteristics in such devices.

BACKGROUND

Personal audio devices including, without limitation, mobile/cellular telephones, smart phones, palmtop computers, personal digital assistants, tablet devices, portable media players including MP3 players, and other consumer audio devices are in widespread use. Such personal audio devices may include audio signal processing circuitry for generating an analog audio output signal suitable for driving one or more external or internal speakers. Audio signal processing circuitry may include various components that inherently contribute corresponding noise components to the audio output signal.

The relative significance of these various noise components may vary depending upon playback conditions or factors including, without limitation, a volume level selected by a user and a magnitude or amplitude of a digital audio signal provided to or generated within the audio processing circuitry. The noise associated with at least some components may be amplified or attenuated by a power amplifier and the amplified or attenuated noise may contribute to the total noise floor of the analog audio output signal.

Power consumption is a critical metric for any hand held, mobile, or wireless electronic device because its power consumption is a direct determinant of how long the device may be operated before it is necessary to recharge the device's battery. Generally, however, power consumption increases as performance parameters including, without limitation, signal-to-noise ratio, increase. As a result, desirable power consumption reductions may be associated with reduced or degraded performance parameters.

SUMMARY

In accordance with the teachings of the present disclosure, one or more disadvantages and problems associated with existing approaches to achieving lower power consumption and/or other desirable improvements without noticeably impacting audio performance may be reduced or eliminated. Subject matter disclosed herein includes references to various parameters of an audio playback path and references to modifying values of those parameters.

In accordance with embodiments of subject matter disclosed herein, an audio apparatus may include one or more playback path components and a playback controller. The playback path components may include a digital modulator, a digital-to-analog converter (DAC), and a variable attenuation power amplifier including a network or ladder of one or more resistors coupled to the power amplifier. The digital modulator may be configured to receive a playback (PB) signal containing a digitally encoded representation of audio content intended for playback on an acoustic transducer such as a speaker. The digital modulator may perform any of various digital signal processing including, without limitation, interpolation and sampling rate conversion, to produce a digitally encoded audio input signal in a digital encoding that is compatible with digital encoding recognized or otherwise supported by the DAC.

The DAC may be configured to receive the audio input signal and convert it to an analog signal referred to herein as the preamplifier signal. The power amplifier may be configured to receive the preamplifier signal from the DAC and an analog attenuation (or gain) signal from the playback controller. The power amplifier may amplify or attenuate the preamplifier signal based at least in part on the analog attenuation to produce an analog audio output signal suitable for driving a speaker or other form of acoustic transducer.

The playback controller may be configured to receive a volume control signal from a volume control and playback parameters from the playback path. The playback path may be configured to configure or control various playback parameters including the analog attenuation via the analog attenuation signal in accordance with the volume control signal. In addition, the playback controller may monitor the playback parameters against a set of one or more playback criteria.

A playback criterion may indicate whether the playback path is in a suboptimal playback state, i.e., a playback state in which a change of one or more playback parameters would improve at least one operational or performance characteristic of the audio device without a measurable degradation of any other audio device performance parameter. The playback controller may be configured to respond to detecting a suboptimal playback state by modifying a playback parameter to transition the playback path to an improved playback state in which at least one performance parameter has been improved with respect to the suboptimal playback state. The performance parameter may include a signal-to-noise ratio associated with the playback path, a total noise floor associated with the playback path, a dynamic range of the audio output signal, harmonic distortion associated with the audio output signal, as well as the cumulative power consumption of the playback path.

In various embodiments, playback parameters that may be monitored and/or modified by the playback controller include playback parameters associated with the DAC. Modifying the selected playback parameter may include reducing or otherwise modifying a sampling frequency of the DAC, a gain of an input stage of the DAC, which may be referred to herein as the digital gain, a common mode output voltage of the DAC, a level shifting current from the DAC output to an output of the power amplifier, an impedance of one or more resistors in a resistor string coupled to the power amplifier to provide negative feedback, a switching current associated with a switched capacitor DAC, and reducing a switching current associated with a charge pump providing a supply voltage to the power amplifier. The DAC may include a delta sigma modulator and the playback parameters may include delta sigma modulator parameters. For example, a delta sigma modulator parameter may include a sampling rate of the delta sigma modulator. In these embodiments, modifying the selected playback parameter may include reducing a sampling rate of the delta sigma modulator.

The playback criterion may be associated with one or more playback parameters such as the analog attenuation of the power amplifier, an amplitude of the audio input signal and/or the preamplifier signal, a digital gain of the DAC input stage, and an amplitude of the audio input signal.

In at least one embodiment, a suboptimal playback state may be indicated when noise attributable to one of the playback path components dominates the total noise floor of the playback path. When noise attributable to the power amplifier, as an example, is substantially greater than noise attributable to the digital modulator or the DAC, the playback controller may modify one or more parameters of the digital modulator or the DAC to reduce the power consumption of the applicable playback path component. In some embodiments, this non-uniform noise attribute occurs at low volume, e.g., when a magnitude of the volume control signal is below a volume threshold or when the volume control signal produces an analog attenuation signal below a gain threshold.

Some embodiments may modify a playback parameter associated with the digital modulator. A sampling frequency associated with the digital modulator may be reduced to reduce digital modulator power consumption. In some embodiments, the digital modulator may include a delta sigma converter of an order that is programmable or otherwise selectable. The playback controller may reduce the order of the delta sigma converter to reduce power consumed by the digital modulator. Although reducing the sampling frequency and/or reducing the order of the sigma delta converter may increase noise or error associated with the digital modulator, at low volume, the total noise floor of the playback path may still be dominated by noise attributable to the power amplifier. Some embodiments may modify a playback parameter associated with the DAC.

The DAC may include a gain stage that amplifies or attenuates the input signal, and the playback controller may control the digital gain signal to modify this digital gain stage. The playback controller may also reduce a sampling frequency associated with the DAC. The DAC may be a unipolar, differential signal DAC and, in these embodiments, the preamplifier signal may include a non-zero common mode component. Depending upon the amplitude of preamplifier signal, the playback controller may be configured to reduce the magnitude of common mode voltage to reduce power consumption dissipated in the resistor string associated with the power amplifier.

In at least one embodiment, a portion of the reduction in power consumption that occurs as a result of a modification of a playback parameter may be “recycled” to reduce noise elsewhere in the playback path. A reduction in DAC sampling frequency, for example, reduces DAC power consumption and increases DAC noise. As discussed previously, the DAC noise increase is attenuated by the analog attenuation in the power amplifier and may not be measurably significant relative to the noise attributable to the power amplifier when the playback path is in a low volume state. From this modified playback path state, however, a second playback parameter modification may be made to trade off a portion of the power consumption savings for a reduction in the total noise floor. Because the power amplifier noise dominates the total noise floor at low volume, the power/noise trade off may include increased power consumption at the power amplifier.

Some playback path embodiments may include first noise sources and second noise sources. Noise attributable to a first noise source may scale proportionally with the gain G of the power amplifier whereas the second noise sources may scale in proportion to 1+G. In at least some of these embodiments, modifying a playback parameter of a first noise source to reduce power consumption may result in an increase in noise associated with a first noise source (in proportion to the reduction of the volume) while maintaining noise associated with the second noise sources. In these embodiments, the increase in first source noise may be permitted in exchange for lower power consumption. Moreover, in at least one embodiment, some of the power consumption reduction that occurs in the DAC or the digital modulator may be effectively diverted to the power amplifier to reduce 1+G noise associated with the power amplifier and thereby achieve a reduction in noise floor as well as power consumption.

The playback controller may be configured to reduce noise associated with the second noise source by increasing DAC input stage gain, e.g., by increasing the input stage quiescent current or transconductance.

The playback controller may be configured to perform transition procedures to reduce or prevent audible discontinuities including audible pops and clicks that may occur during playback state transitions.

In accordance with these and other embodiments of the present disclosure, methods for providing an output signal to an audio transducer may include receiving a volume control signal indicative of a volume control setting and receiving playback parameters from a playback path. The methods may further include generating an analog control signal based in part on the volume control signal. The playback parameters may be monitored and evaluated for satisfaction of any one or more of a set of playback criteria. Upon detecting satisfaction of a playback criteria, the methods may include modifying one or more playback parameters to reduce power consumption or improve a different performance parameter, preferably without measurably degrading any other performance parameters.

When the analog power amplifier attenuation, as determined by the volume control signal, is sufficiently low, power consumption parameter modifications related to the digital modulator and the DAC may be performed beneficially without regard to the audio input signal characteristics because distortion resulting from the power consumption parameter modifications, as attenuated by the power amplifier, will be inaudible or substantially inaudible.

In at least one embodiment, a change in volume that will result in a transition of the volume control signal from below the volume threshold to above it initiates a volume change procedure that includes delaying an increase in the gain signal until power consumption parameters associated with the digital modulator and the DAC are restored to normal volume values. Once the power consumption parameters of the digital modulator and the DAC have been restored, then the analog attenuation of the power amplifier is increased in accordance with the volume change. Conversely, in at least one embodiment, when a volume transition from above the threshold to below it occurs, the power amplifier gain is reduced in accordance with the volume reduction before the power consumption parameters of the digital modulator and DAC are modified. This volume change procedure, which may include a short delay between a change in the volume control signal and a resulting change in the gain signal, beneficially ensures that modifications to the digital modulator and DAC power consumption parameters occur in a low volume state.

Modifying a power consumption parameter from a normal volume value to a low volume value, or vice versa, may occur in incremental stages involving power consumption parameter values intermediate between the normal volume value and the low volume value. In at least one embodiment, for example, when changing a sampling frequency of the DAC from a normal volume value (e.g., 5 MHz) to a low volume value (e.g., 2.5 MHz), the sampling frequency may be modified downward in a series of increments (e.g., 0.5 MHz increments). Although the DAC sampling frequency is the power consumption parameter in this example, analogous procedures involving intermediate values may apply to other power consumption parameter values. Modifying a power consumption parameter in stages may reduce or eliminate audible pops that might occur if a power consumption parameter were changed directly from a normal volume value to a low volume value in a single step.

A modification of a power consumption parameter that results in a capacitance change may produce a waveform discontinuity that causes an audible pop due to high currents associated with rapid capacitor charging or discharging. In at least one embodiment, the playback controller implements a pre-charge delay before switching any capacitive element into the playback path. During the pre-charge delay, one or more capacitors associated with the additional capacitance may be charged to an expected voltage level so that capacitive popping is eliminated or reduced to inaudible levels.

The playback controller may time the modification of a power consumption parameter based on the audio signal itself. When the modification of a power consumption parameter is associated with audio signal phase changes, as an example, the modification may be synchronized or otherwise controlled to occur at or near an audio signal amplitude peak since audio signals are most phase-change-sensitive at or near signal amplitude peaks.

In accordance with embodiments disclosed herein, an audio signal generation method may include monitoring a playback path of an audio device playback state transition. The transition of interest may be characterized or otherwise indicated by a transition of the analog attenuation below an attenuation threshold or by an audio input signal amplitude that is below an amplitude threshold. The playback path may include, in addition to other components, a DAC configured to receive an audio input signal and generate a preamplifier signal and a variable attenuation power amplifier configured to generate an audio output signal in accordance with the preamplifier signal and an analog attenuation indicated by an analog attenuation signal. In response to detecting one of the identified playback state transitions, embodiments of the method may modify a configuration of the playback path to improve at least one performance parameter. The performance parameter that improves may be a cumulative power consumption of the playback path, a signal-to-noise ratio of the audio output signal, or another suitable parameter.

In addition to improving one or more performance parameters, modifying the playback path configuration may degrade one or more performance parameters including, without limitation, a signal to noise ratio of the DAC and a settling time of a delta sigma modulator of the DAC depending on the playback parameter. The playback parameter that is modified may be a sampling frequency, an input stage gain, a common mode voltage of the preamplifier signal, a number of delta sigma stages in a modulator of the DAC, and a level shifting current from an output of the DAC to an output of the power amplifier.

Modifying the playback parameter may include a transitional processing including controlling a transition of the analog attenuation based on an amplitude of the audio input signal and controlling the transition of the analog attenuation transition relative to the modifying of the playback parameter. For example, it may be desirable to modify the playback parameter at low gain, i.e., after the analog attenuation has been transitioned below the attenuation threshold. Conversely, when a transition from a low volume state to a normal volume state occurs, the analog attenuation and the playback parameter may be restored to their original values. In this scenario, the restoration of the playback parameter may precede the restoration of the analog attenuation so that the playback state change occurs at low gain and thereby potentially reduces or eliminates unintended spurious audible artifacts.

Moreover, playback path modifications affect the applicable audio signals in different ways, with some modifications primarily producing phase changes in the audio signal, some modifications producing high frequency components, current spikes, and so forth. Audible pops and clicks attributable to some of these modifications may be reduced or eliminated by coordinating the attenuation transition with the audio signal itself and, more specifically, with an amplitude of the audio signal. Accordingly, in some embodiments, transitioning the analog attenuation is synchronized with an occurrence of a zero crossing (zero amplitude), a peak amplitude, and predetermined threshold amplitude. Zero crossings and peak values may be determined from either the digitally encoded audio input signal or from the analog preamplifier signal. In some embodiments, detecting signal amplitude from the digital encoding is simpler and an amplitude detection circuit may be determining zero crossings, peak values, and so forth based on the digitally encoded audio input signal.

In accordance with still other embodiments disclosed herein, an audio integrated circuit (IC) may include an audio playback path, an audio volume input, and an audio output. The audio playback path may receive a digitally encoded playback signal and generate, in accordance with the playback signal, an analog output signal including an output noise component. The audio volume input may be configured to receive a volume control signal from an audio volume control and the audio output may provide the audio output signal to an acoustic transducer. Embodiments of the audio IC may perform operations including monitoring a playback state of the playback path. Responsive to detecting a playback state transition indicative of a transition to a playback state in which noise attributable to a first playback path component dominates the output noise present in the audio output signal, the audio device may modify a configuration of a second playback path component.

The noise attributable to the first playback path component may be proportional to 1+G and the noise attributable to the second playback path may be proportional to G, where G indicates an analog attenuation of a power amplifier in the playback path. Modifying the second playback path component may decrease a power consumption of the playback path, but it may also increase noise attributable to the second playback path component. The first playback path component may be a power amplifier that drives the audio output signal. The second playback path component may be a digital modulator configured to receive a playback signal containing playback content and generate an audio input signal or a DAC configured to generate an analog preamplifier signal in accordance with the audio input signal and provide the analog preamplifier signal to the power amplifier. Modifying the second playback path component may include modifying any one or more of the following parameters: a sampling frequency of the digital modulator, a number (order) of delta sigma modulator stages in the digital-to-analog converter, a digital gain associated with a gain stage of the digital-to-analog converter, a common mode voltage produced by the digital-to-analog converter, a level shifting current from the digital-to-analog converter to an output of the power amplifier, and an impedance of at least one resistor coupled to the power amplifier.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

A personal audio device preferably exhibits high performance characteristics and consumes little power. Generally, however, power consumption and performance are in tension, with an improvement in one often coming at the cost of the other. Nevertheless, personal audio devices may offer opportunities to alter the configuration or state of the playback path based on frequently observed usage patterns, to conserve power or improve one or more other operational or performance characteristics of a personal audio device without sacrificing performance in the form of increased noise, higher harmonic distortion, or the like.

Figure 1:
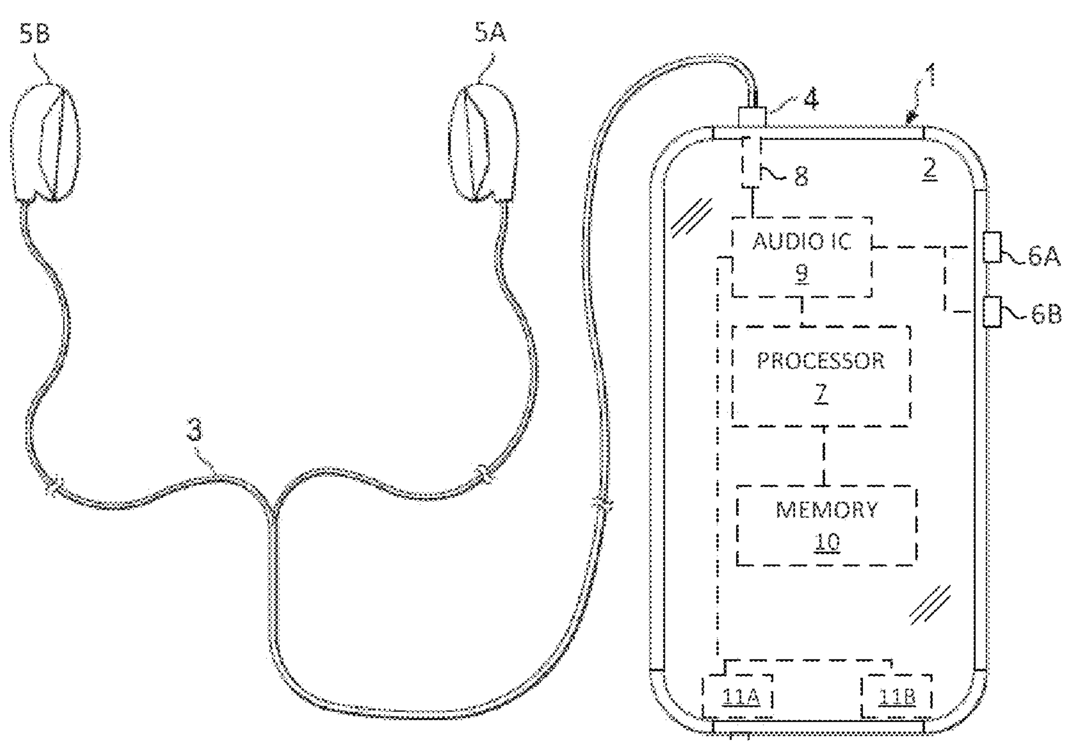
FIG. 1 is an illustration of an example personal audio device, in accordance with embodiments of the present disclosure.

FIG. 1 illustrates selected elements of a personal audio device 1 in accordance with embodiments disclosed herein. FIG. 1 depicts personal audio device 1 coupled to a headset 3 through a plug 4 inserted in a jack 8 of personal audio device 1. The depicted headset 3 includes a pair of earbud speakers 5A and 5B. Headset 3 as depicted in FIG. 1 is merely an example, and it is understood that personal audio device 1 may be used in connection with any suitable acoustic transducers including without limitation, headphones, earbuds, in-ear earphones, and external speakers. The personal audio device 1 depicted in FIG. 1, for example, includes internal speakers 11A and 11B such that audio playback may occur via internal speakers 11A and 11B when there is no headphone set 3 or other type of audio transducer connected to jack 8.

Personal audio device 1 may include a touch screen display 2 for displaying information to and receiving user input from a user. Alternatively, personal audio device 1 may include a standard liquid crystal display (LCD) for displaying information and one or more of various buttons, sliders, dials or other control hardware disposed on the face and/or sides of personal audio device 1 to receive user input. In still other embodiments, a personal audio device 1 may include touch screen display 2 as well as one or more hardware controls. The personal audio device illustrated in FIG. 1, for example, includes a touch screen display 2 and a pair of volume control inputs 6A and 6B, one of which may be suitable for increasing volume and the other of which may be suitable for decreased volume.

In at least one embodiment, personal audio device 1 includes a processor 7 having access to memory 10 and connected or otherwise coupled to an audio integrated circuit (IC) 9. Audio IC 9 may include hardware, firmware, and/or software for generating an analog audio signal for transmission to headset speakers 5A and 5B of FIG. 1 and/or another audio transducer. In addition to its audio playback functionality, embodiments of personal audio device 1 may include or support functionality for a wide variety of applications including, without limitation, wireless communication functionality including cellular telephony, broadband data functionality including web browsing and email, and multimedia playback functionality including high definition (HD) multimedia streaming.

The personal audio device 1 depicted in FIG. 1 includes a processor 7 coupled to a memory 10 and to an audio IC 9. In various embodiments, processor 7 may be implemented as a general purpose microprocessor, an embedded controller, an application specific integrated circuit, programmable logic including field programmable logic, or any other suitable form of hardware or circuitry. Functionality supported by processor 7 may encompass functionality embedded in processor executable instructions stored in a computer readable medium such as memory 10 or in one or more other storage elements not explicitly depicted in FIG. 1 including, without limitation, cache memory, non-volatile semiconductor memory including flash memory, or any other computer readable storage medium suitable for a portable electronic device such as portable audio device 1. In some embodiments, instructions executable by processor 7 may include groups of instructions for one or more operating systems, programs, or applications. In at least one embodiment, all or some of such operating systems, programs, and applications may be stored in memory 10 when personal audio device 1 is powered on and stored in a nonvolatile memory (not depicted) when personal audio device 1 is powered off or in another reduced functionality power state.

Figure 2:
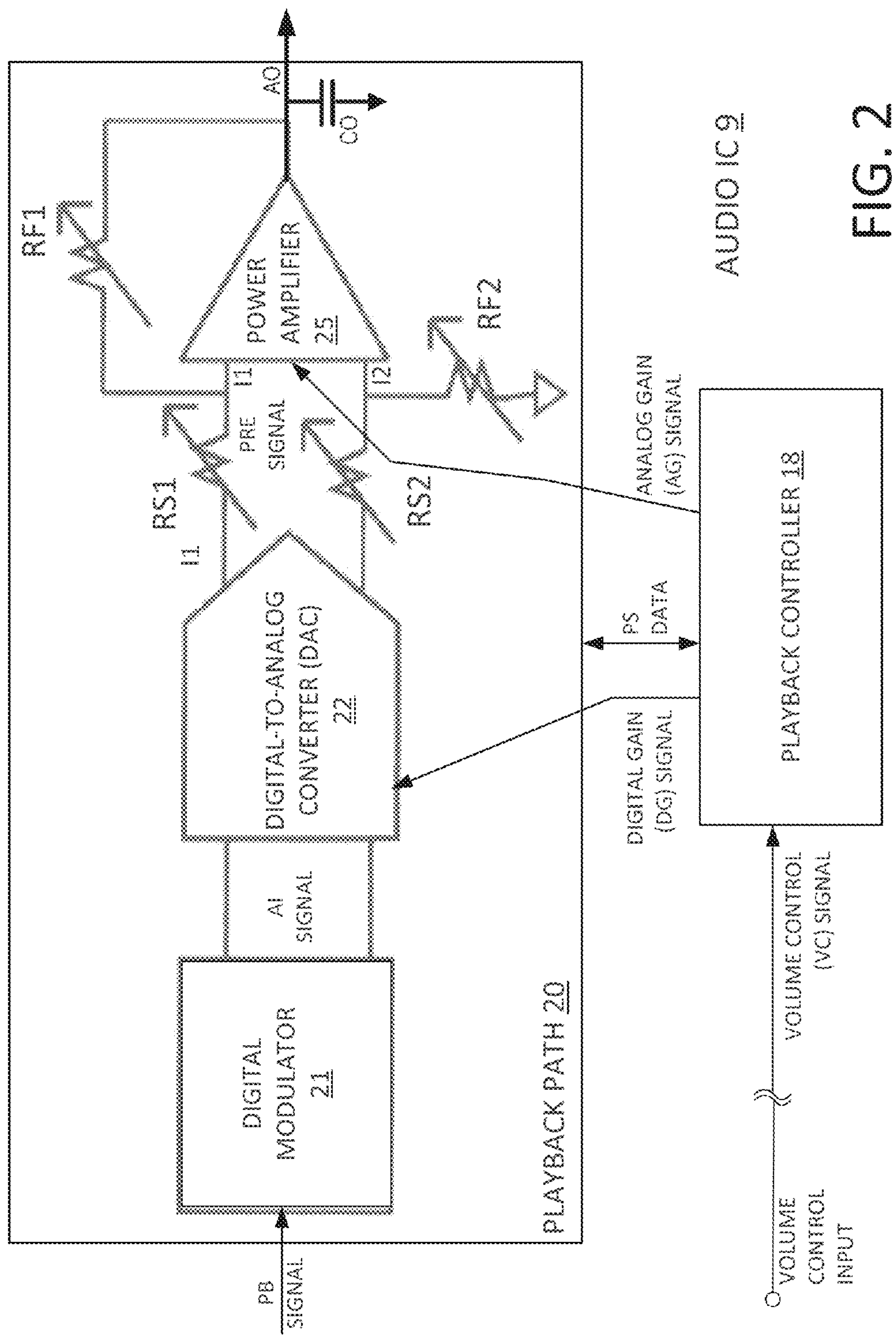
FIG. 2 is a block diagram of selected components of an example audio integrated circuit of a personal audio device, in accordance with embodiments of the present disclosure.

FIG. 2 is a block diagram illustrating selected components of an example audio IC 9 in accordance with embodiments of subject matter disclosed herein, including the audio IC 9 of personal audio device 1 depicted in FIG. 1. The audio IC 9 illustrated in FIG. 2 includes a playback path 20 coupled to a playback controller 18. Playback path 20 receives a digitally encoded playback (PB) signal representing desired audio content intended for playback on an acoustic transducer, such as a speaker, and produces an analog audio output (AO) signal that represents the playback audio and is suitable for driving the acoustic transducer.

The playback path 20 depicted in FIG. 2 includes multiple signal processing components including a digital modulator 21, a digital-to-analog converter (DAC) 22, and a power amplifier 25, any one or more of which may include analog, digital, mixed signal circuits, or any combination thereof, as well as firmware and software, including executable instructions stored in a volatile or nonvolatile machine readable storage medium, such as memory 10 (FIG. 1) or a non-volatile or other storage medium not depicted. In the illustrated playback path 20, digital modulator 21 receives the PB signal and provides an audio input (AI) signal to DAC 22. DAC 22 converts the AI signal to an analog signal identified in FIG. 2 as the preamplifier (PRE) signal. The PRE signal is amplified by power amplifier 25 and its associated resistors to produce the analog AO signal intended to drive a speaker or similar acoustic transducer.

The playback controller 18 depicted in FIG. 2 receives a volume control (VC) signal from a user-controllable volume control input (VI), such as the volume controls 6A, 6B depicted in FIG. 1. Playback controller 18 may also monitor, obtain, receive, or otherwise access playback state (PS) data, also referred to herein as playback parameter data from one or more of the signal processing components of playback path 20. The PS data may indicate a playback state of playback path 20. The playback state may include configuration settings or other characteristics of one or more of the playback path components as well as characteristics of the audio signals that playback path 20 is processing. In at least one embodiment, playback controller 18 provides an analog attenuation (AG) signal to power amplifier 25 and a digital gain (DG) signal to a gain stage of DAC 22. Playback controller 18 may determine values for the AG signal and the DG signal based on the VC signal, the PS data, or a combination thereof.

In at least one embodiment, playback controller 18 monitors the PS data against one or more playback criteria that, when satisfied, indicate playback states of interest. The playback states of interest may include playback states in which a first audio performance parameter may be improved unilaterally, i.e., a playback state in which one or more playback parameters may be altered to improve a first performance parameter without negatively impacting any other second performance parameter. In some embodiments, the first performance parameter may be a power consumption parameter indicative of power consumption in playback path 20 or in any one or more of playback path components. In these embodiments, the playback criteria may indicate playback states that present an opportunity to reduce power consumption without perceptibly or noticeably impacting playback audio performance, whether measured in terms of total noise floor, total harmonic distortion, a signal-to-noise parameter such as a signal quantization to noise ratio (SQNR) indicative of a relationship between the maximum nominal signal strength and the quantization error introduced in the analog-to-digital conversion, or any other suitable audio performance parameter.

Recognizing that reducing the power consumed by a signal processing device generally involves changing a parameter in a way that will result in an increase in the noise attributable to the applicable component, the first criteria may identify a playback state in which the noise attributable to a "noisy component" of the playback path dominates the total noise floor, e.g., a ratio of noise associated with the noisy component to noise associated with a "quiet component" exceeds, e.g., 30 dB. This playback state may be referred to herein as a quiet component playback state, i.e., a playback state in which a ratio of the noise attributable to a noisy component to the total noise floor is less than a specified threshold (in dB), e.g., −30 dB or −40 dB. Qualitatively, playback controller 18 responds to detecting a quiet component playback by modifying playback parameter(s) to trade off increased quiet-component noise for reduced quiet-component power consumption because, even at substantially increased levels of quiet-component noise, the noisy component still dominates the total noise floor.

The playback path 20 illustrated in FIG. 2 receives a single-ended PB signal, employs differential signaling internally, and produces a single-ended AO signal. In at least one embodiment, DAC 22 is a unipolar converter requiring or generating a single power supply voltage, e.g., a single supply voltage of positive polarity. In other embodiments, DAC 22 may generate a second power supply voltage of an opposite polarity internally. In still other embodiments, playback path 20 may employ one or more external power supplies of a first polarity, e.g., positive, and one or more external power supplies of a second polarity, e.g., negative. Moreover, other embodiments of playback path 20 may receive a differential PB signal, employ single-ended signals internally, generate a differential AO signal, or any appropriate combination thereof.

The playback controller depicted in FIG. 2 receives a VC signal indicative of a volume control input provided by a user via volume control such as volume controls 6A and 6B of FIG. 1. In at least one embodiment, playback controller 18 also monitors or otherwise obtains, receives, or accesses PS signals from playback path 20. The PS signals may correspond to or otherwise indicate values for selected playback parameters. The playback parameters may include operational parameters indicating status, configurations, settings, and the like corresponding to one or more of the playback path components. The playback parameters may also include performance parameters indicating values indicating one or more performance characteristics of playback path 20. In at least one embodiment, the performance parameters include, without limitation, one or more signal-to-noise parameters including the SQNR parameter, a total noise floor parameter, and a total harmonic distortion (THD) parameter.

A capacitor CO may be utilized to couple the output signal to the transducer or line level output, particularly if power amplifier 25 is operated from a unipolar power supply having a quiescent voltage substantially differing from ground. The power supply may provide the power supply rail inputs of power amplifier 25. In some embodiments, power supply 10 may comprise a charge pump power supply.

Figure 3:
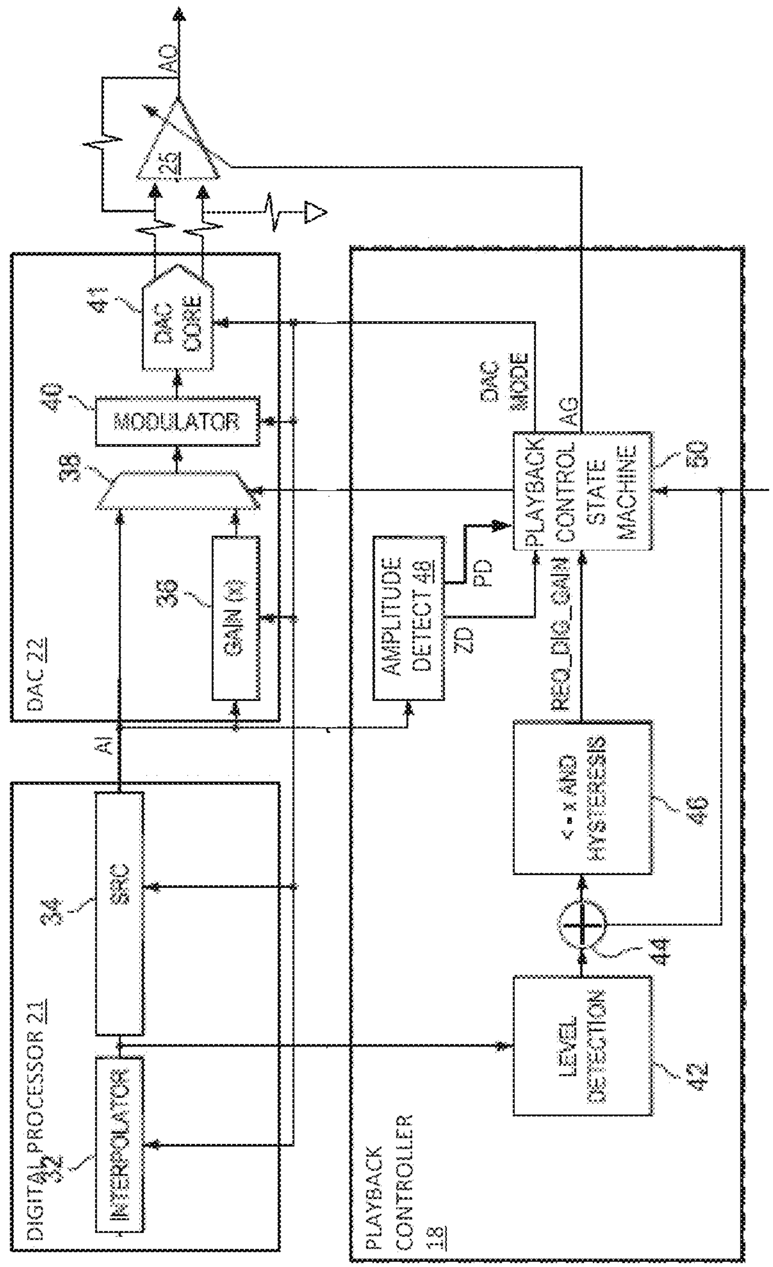
FIG. 3 is a block diagram of selected components of a gain control circuit for use within the audio integrated circuit depicted in FIG. 2, and selected components of an audio integrated circuit which may be coupled to the gain control circuit, in accordance with embodiments of the present disclosure.

FIG. 3 is a block diagram illustrating selected components of an example playback controller 18, an example digital modulator 21, and an example DAC 22 suitable for use with audio IC 9. The digital modulator 21 of FIG. 3 includes an interpolator 32 and a sample rate converter (SRC) 34 configured to convert a digital signal, such as the PB signal, encoded according to a first encoding associated with a first sampling rate to a digital signal having a second encoding associated with a second sampling rate where the second encoding and sample rate are compatible with one or more encodings and sample rates supported by DAC 22.

The DAC 22 illustrated in FIG. 3 includes a gain element 36 that amplifies the AI signal and provides an amplified AI signal to a first input of a multiplexer 38. A second input of multiplexer 38 receives the AI signal, without amplification, directly from SRC 34. In the depicted embodiment, playback controller 18 includes a playback control state machine 50 that provides a control signal to a control input of multiplexer 38 to determine whether the multiplexer 38 outputs the un-amplified AI signal or the amplified AI signal. The DAC 22 illustrated in FIG. 3 further includes a modulator 40 to generate an oversampled, low resolution signal, and a DAC core 41 to produce the preamplifier signal as the output of the DAC.

As shown in FIG. 3, playback controller 18 may include a level detection circuit 42, a combiner 44, a comparator 46, an amplitude detection circuit 48, and a playback control state machine 50. Level detection circuit 42 may include any suitable system, device, or apparatus for receiving an output signal of interpolator 32 and/or SRC 34, determining a magnitude of such output signal, and outputting a signal indicative of such magnitude, which will also be indicative of an amplitude of the AI signal. Combiner 44 may include any suitable system, device, or apparatus for receiving the output signal from level detection circuit 42 indicative of the amplitude of the AI signal and receiving a volume control signal and summing these two signals to generate an output signal indicative of a desired amplitude of the AO signal. Comparator 46 may compare the output signal of combiner 44 with a predetermined threshold and, based on such comparison, output a requested digital gain (RDG) signal. In at least one embodiment, the RDG signal indicates whether the desired amplitude of the AO signal is greater or lesser than such predetermined threshold magnitude. In some embodiments, comparator 46 may implement hysteresis, such that the RDG signal only transitions when the output signal of combiner 44 remains above or below the predetermined threshold magnitude for a minimum duration of time (e.g., 0.1 seconds to place any switching artifacts outside the human-perceptible audio range).

Amplitude detection circuit 48 may include any suitable system, device, or apparatus for detecting the amplitude and amplitude characteristics of a signal in the playback path, including, as shown in FIG. 3, the AI signal output from SRC 34. The amplitude detection circuit 48 illustrated in FIG. 3 outputs a zero detect (ZD) signal that indicates when zero crossings occur and a peak detect (PD) signal that indicates when amplitude peaks occur.

Playback controller 18 may receive the VC signal, the RDG signal, and the ZD signal and, based on such signals, generate the digital gain signal provided to DAC 22 and the analog attenuation signal provided to power amplifier 25. In addition, playback controller 18 may receive playback parameters that indicate a state of playback path 20 including, without limitation, configuration settings for playback path components, and characteristics of the analog and digital audio signals that the playback path is currently processing. The playback control state machine 50 may maintain one or more access playback criteria, not depicted in FIG. 3, and monitor the playback parameters for satisfaction with any of the playback criteria. In at least one embodiment, the playback criteria identify playback states that indicate an opportunity to reduce power consumption or output noise without measurably degrading overall performance in terms of any other performance parameter.

For example, playback controller 18 may monitor a playback criterion that identifies a low volume playback state. In at least one embodiment, the low volume playback state may be indicated when a magnitude of the analog attenuation signal is below a specified low volume threshold. In some embodiments, the low volume threshold may be −20 dB such that playback controller 18 identifies playback path 20 as being in a low volume state when the analog attenuation signal is below −20 dB. In this example, the criterion is determined by the value of a single playback parameter, the analog attenuation signal. In other embodiments, other criterion may include criteria defined in terms of two or more playback parameters.

When playback controller 18 identifies a low volume playback state, the playback control state machine 50 may be configured to modify at least one playback parameter to reduce power consumption of at least one playback path component. In at least one embodiment, the playback control state machine may control any of a number of playback parameters to reduce power consumption when a low volume playback state is identified.

Playback control state machine 50 may respond to detecting a transition to a low volume state by modifying, subject to certain transitional procedures described below, a playback parameter to reduce power consumption of digital modulator 21, DAC 22, the power amplifier resistor string, a switching frequency of a charge pump that may be used to achieve, for example, a negative power supply necessary to generate a ground-centered AO signal.

Playback control state machine 50 may, in some embodiments, achieve a reduction in power consumed by DAC 22 following a playback state transition to a low volume state. Power consumption of DAC 22 may be reduced by reducing a sampling frequency associated with the DAC, as one example. In some embodiments, a sampling frequency of DAC 22 is programmable or selectable by playback control state machine 50. The sampling frequency may, in some embodiments, be selectable between one of two sampling frequency values, a standard value and a reduced power value. In one such embodiment, the standard value may be approximately 3 MHz and the reduced power value may be approximately 1.5 MHz, although these are merely example sampling frequencies. Other embodiments may employ more than two sampling frequency alternatives when a playback state transition to low volume occurs. Similarly, other embodiments may employ different sampling frequencies in the low volume state, the normal state, or a combination thereof.

In some embodiments, DAC 22 may be a unipolar converter that operates on a signal voltage supply. In these embodiments, the playback control state machine 50 may reduce the common mode voltage to reduce power consumption in associated with the resistor string of the power amplifier. In a unipolar converter embodiment, DAC 22 may generate signals of only one polarity, e.g., all voltage signals within DAC 22 have a voltage that is positive relative to a ground voltage. The DAC 22 illustrated in FIG. 3 generates the preamplifier signal as a differential signal in which the value of a signal is indicated as the difference between the two differential signals, a high signal that may be represented as CM+½(SIG) and a low signal that may be represented as CM−½(SIG) where SIG is the value of the signal of interest and CM represents the common mode voltage of the preamplifier signal. To accommodate voltage swings of a given amplitude, the CM voltage of a unipolar converter must have a minimum magnitude of ½(SIGMAX)+MARGIN where SIGMAX is the maximum value of the signal and MARGIN is included to accommodate voltage and/or current spikes or other transients associated with noise including thermal noise and the like.

Maintaining a positive valued CM voltage at the output of DAC 22 will result in power dissipation in the resistor string of power amplifier 25 illustrated in FIG. 3, which is configured to produce a single-ended AO signal centered about ground. Power dissipation in the RS1 resistor (shown in FIG. 2) associated with the CM voltage varies proportionately with the square of CM voltage such that a 20% reduction of CM voltage produces a 36% reduction in CM-related power consumption.

Accordingly, playback control state machine 50 may reduce power dissipated by the DAC in the resistor string under appropriate conditions by modifying the DAC configuration to reduce the CM voltage. As indicated previously, the minimum CM voltage is a function of the amplitude of the preamplifier signal. In one embodiment, the playback state controller 50 may modify the DAC configuration to reduce the CM voltage in response to detecting an amplitude of the preamp signal below an amplitude threshold. The CM voltage reduction in this embodiment may be accompanied by a change in biasing conditions of the resistor string and power amplifier so a given value of the preamplifier signal produces the same current before and after the CM voltage is reduced. This change in biasing may include biasing a reference terminal of the power amplifier to a negative-valued reference voltage. Since a charge pump or other hardware element may be required to produce a negative reference or rail voltage when the audio output signal is a single-ended ground centered signal, this requirement for a negative value reference voltage may not impose significant additional cost or complexity on the audio device. It is noted that the CM voltage reduction that may be performed when the amplitude of the preamplifier signal is low may occur without regard to the analog attenuation of the volume of the power amplifier.

In another example, a playback criterion suggesting a beneficial playback state configuration modification may again identify a low amplitude of the preamplifier signal and respond by configuring the playback path to produce a lowered common mode voltage, but instead of adjusting the biasing of the resistor string as described above, the resistor string itself may be modified in accordance with the common mode voltage reduction. In these embodiments, a reduction of common mode voltage may be accompanied by a corresponding change in the resistance of the signal resistor RS1 so that the RS1 current remains the same or approximately the same before and after playback path modification. To maintain the pre-modification amplification, the feedback resistance RF1 (shown in FIG. 2) may be changed proportionately with RS1 so that the RF1/RS1 ratio remains the same or approximately the same. In this example, the power amplifier resistors may be programmable or selectable resistance resistors and the resistances may be controlled by the playback control state machine 50.

Reducing the common mode voltage and the resistance of the power amplifier resistors proportionately achieves a reduction in voltage without a corresponding change in current and thereby achieves a reduction in power consumption proportional to the voltage reduction since power is equal to the product of voltage and current (P=V*I).

In another embodiment involving a low amplitude preamplifier signal criterion, the level shifting current, i.e., the current from DAC 22 through RS1 and RF1 to the power amplifier output, is reduced by increasing the resistances in the resistor string. In these embodiments, a doubling of the resistor string resistors may reduce the level shifting current by fifty percent (50%), as an example. A power consumption attributable to the level shifting current is thereby achieved since power consumption is proportional to the square of the current ($I^2$), but is only linearly proportional to resistance (R).

When the amplitude of the preamplifier signal is low and the playback path is in a low noise state, some embodiments of playback control state machine 50 may modify playback parameters to decrease the total noise floor in lieu of decreasing power consumption associated with the common mode voltage. In these embodiments, playback control state machine 50 may exchange analog attenuation at the comparatively noisy power amplifier for digital gain at DAC 22, thereby reducing the amplification or increasing the attenuation where total noise floor is most directly reduced. In one embodiment, a playback criterion indicates a combination of low analog attenuation, i.e., analog attenuation below a low volume threshold, and low preamplifier amplitude, i.e., preamplifier amplitude below an amplitude threshold. When low analog attenuation occurs at the same time as low preamplifier signal amplitude, playback control state machine 50 may modify the playback path by reducing the analog attenuation and increasing the digital gain such that the sum of the two gains before and after the modification is the same or is approximately the same.

In still another embodiment, the playback control state machine 50 may modify a digital modulator configuration setting or other parameter in response to detecting a playback state that satisfies a low volume condition. In these embodiments, similar to embodiments that reduce the DAC sampling rate, the sampling rate associated with SRC 34 may be reduced with relative performance impunity because the resulting increase in quantization error and other noise associated with the lower sampling frequency is highly attenuated by the power amplifier attenuation and remains negligible relative to the total noise floor, which is dominated by power amplifier noise at low volume.

In another embodiment, personal audio device 1 includes a switching charge pump to produce a desired supply voltage, reference voltage, or rail voltage for one or more playback components. In these embodiments, the charge pump included in the personal audio device is switched periodically, e.g., between a charging state and a discharging at high frequency relative to a bandwidth of the audio content. Higher switching frequencies may produce a more stable reference or supply voltage, but may result in higher power consumption due to higher switching currents. In these embodiments, playback control state machine 50 may control and reduce a switching frequency of any applicable charge pumps in response to detecting a low volume state of the playback path.

In yet another embodiment, the playback control state machine 50 may modify DAC 22 to trade off increased DAC settling time in exchange for reduced DAC power consumption in response to a transition to a low noise playback state being detected. In this embodiment, playback control state machine 50 may bypass one or more stages of modulator 40 in DAC 22. In some embodiments, modulator 40 is a delta signal modulator that may include one or more stages, for example, 1, 2 or 3 stages. In these embodiments, playback control state machine 50 may be configured to bypass a third stage of the modulator, a second stage of the modulator, or both.

In addition to functionality for monitoring playback criteria to detect opportunities for modifying a playback parameter to reduce power consumption or achieve another performance with little or no performance penalty, playback control state machine 50 may include or support features for controlling the modification of any playback parameters.

In some embodiments, for example, a transition of playback path 20 from a normal volume state to a low volume state may result in modification to one or more playback parameters as described previously. In some embodiments, playback control state machine 50 may implement a relatively small delay into a volume control path so that a change in the AG signal resulting from a change in the VC signal is temporally displaced from the change in the VC signal itself. In some embodiments, the delay may be in the range of approximately 1 microseconds to 100 microseconds and in some embodiments, may be equal to approximately 10 microseconds.

In alternative embodiments, audio IC 9 may employ a multi-path solution having at least two audio signal paths including a path having unity digital gain and analog attenuation and another with a non-unity digital gain (e.g., 20 dB) and corresponding non-unity analog attenuation (e.g., −20 dB), wherein the output of one of the audio signal paths may be selected, based on the amplitude of the audio signal, to provide the audio output signal based on the magnitude of the audio signal.

In these and other embodiments, playback control state machine 50 or another component of playback controller 18 may generate a DAC mode signal. In such embodiments, the DAC mode signal may be based on the analog attenuation signal, and DAC 22 may operate in a plurality of modes based on the DAC signal. For instance, when the analog attenuation is below a threshold level (e.g., −40 dB), the DAC mode signal may be set in accordance with a low-power/high-noise mode, while when the analog attenuation is above a threshold level, the DAC mode signal may be set in accordance with a high-power/low-noise mode. To implement the plurality of modes, one or more components of DAC 22 (e.g., interpolator 32, SRC 34, gain element 36, modulator 40, DAC core 41) may be configured to operate at different levels of power consumption based on the DAC mode. For instance, such one or more components may operate at higher frequencies, higher currents, and/or lower effective internal resistances in the low-power/high-noise mode, while operating at lower frequencies, lower currents, and/or higher effective internal resistances in the high-power/low-noise mode. In other embodiments, DAC 22 may include a plurality of paths, each path corresponding to a DAC mode and each path including its own respective interpolator 32, SRC 34, gain element 36, multiplexer 38, modulator 40, and/or DAC core 41, wherein a single one of the plurality of paths is selected to process the audio input signal AI based on the DAC mode. The presence of such a DAC mode based on analog attenuation may reduce power consumption of DAC 22, as use of the DAC mode permits DAC 22 to operate at a lower power consumption when the analog attenuation is sufficiently high, as the additional noise present in the lower-power mode of DAC 22 may be reduced or eliminated by the analog attenuation. Although the foregoing contemplates use of two DAC modes, any suitable number of DAC modes may be employed in audio IC 9.

Similarly, in these and other embodiments, power amplifier 25 may operate in a plurality of analog modes, wherein the analog mode is selected based on the analog attenuation. For instance, when the analog attenuation is below a threshold level (e.g., −40 dB), the analog mode may be set in accordance with a high-power/low-noise mode, while when the analog attenuation is above a threshold level, the analog mode may be set in accordance with a low-power/high-noise mode. As in the case of the DAC mode described above, analog modes may be implemented using multiple paths or may be implemented by varying frequencies, currents, effective internal resistances, and/or other suitable parameters of power amplifier 25.

As a result of the various embodiments disclosed above, playback controller 18 may be configured to select the selectable analog attenuation and select the selectable digital gain such that the analog signal path portion operates at a highest possible attenuation in order to minimize analog thermal noise in an analog signal path portion of audio IC 9 which generates the audio output signal from the analog audio input signal.

Figure 4:
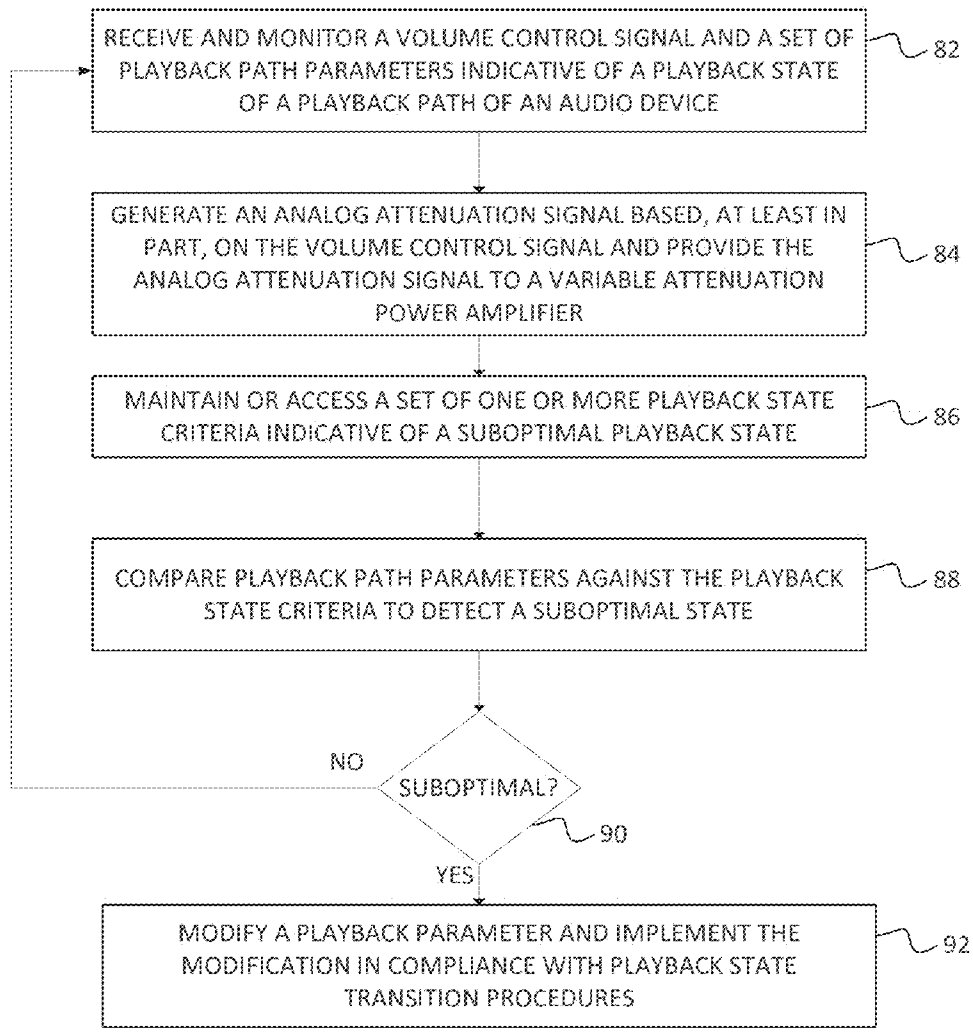
FIG. 4 illustrates selected elements of a method.

Embodiments of subject matter disclosed herein may include methods for managing state and power consumption in an audio device. FIG. 4 illustrates an exemplary method 80 for managing power consumption and other performance parameters. The method 80 represented in FIG. 4 is an example method and other methods encompassed by subject matter disclosed herein may include more, fewer, or different elements that the method 80 depicted in FIG. 4. Method 80 may represent operations performed by a processor or integrated circuit such as the processor 7 and the audio IC 9 of FIG. 1, such as when the processor 7 or audio IC 9 execute processor executable instructions stored in memory 10 or another storage medium. In at least one embodiment, method 80 represents or encompasses operations performed by the playback controller 18 depicted in FIG. 2 and in FIG. 3.

The method 80 illustrated in FIG. 4 includes receiving or otherwise monitoring (block 82) a volume control signal and a set of playback parameters indicative of a playback state of a playback path of an audio device. Method 80 may further include generating (block 84) an analog attenuation signal based, at least in part, on the volume control signal and providing the analog attenuation signal to a variable attenuation power amplifier. A set of one or more playback criteria indicative of a suboptimal playback state may be maintained or accessed (block 86). Method 80 may further include comparing (block 88) playback parameters against the playback criteria to detect a suboptimal playback state, i.e., a playback state that offers an opportunity to reduce power consumption or improve a different operating parameter substantially at no noise or other performance cost. If a suboptimal playback state is detected (block 90), method 80 may modify (block 92) a playback parameter and implement the modification in compliance with playback state transition procedures. If the block 88 comparison between the playback parameters and the playback criterion does not indicate the playback path in a suboptimal state, the method 80 as illustrated in FIG. 4 returns to block 82 to resume the monitoring of playback path criterion.

Figure 5A:
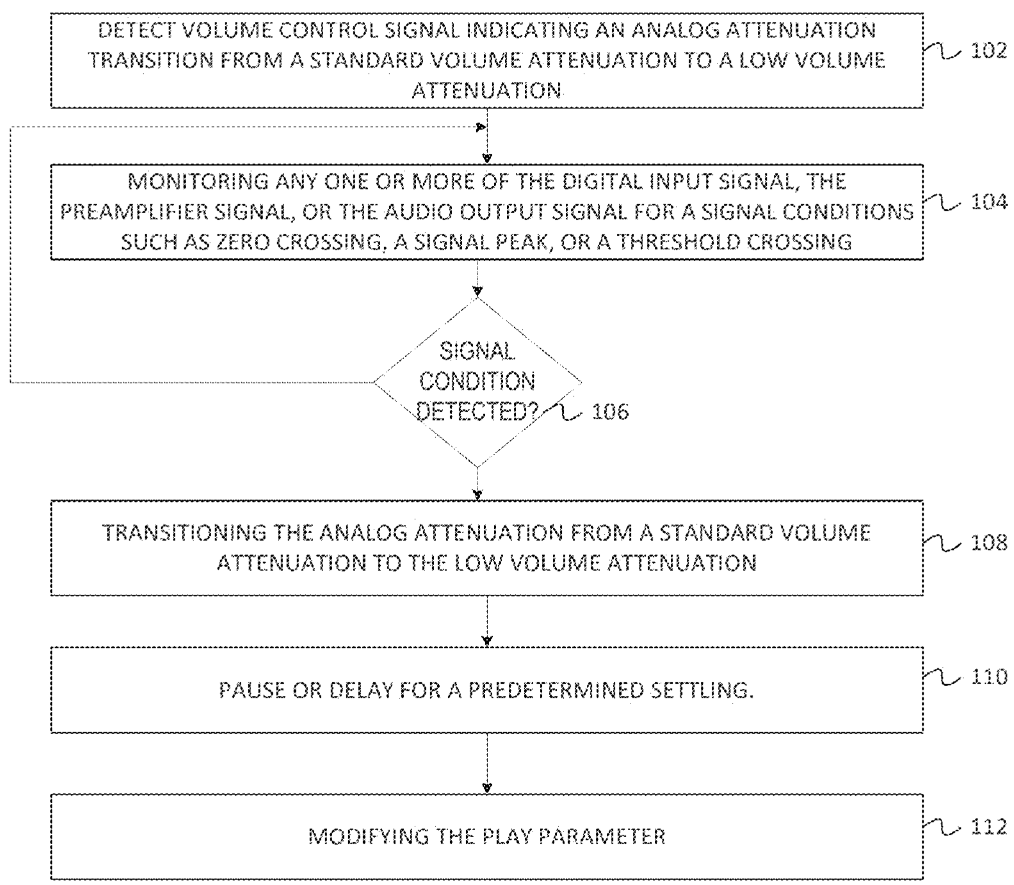
FIGS. 5A and 5B illustrate selected elements of a transition procedure suitable for use with the method of FIG. 4.
Figure 5B:
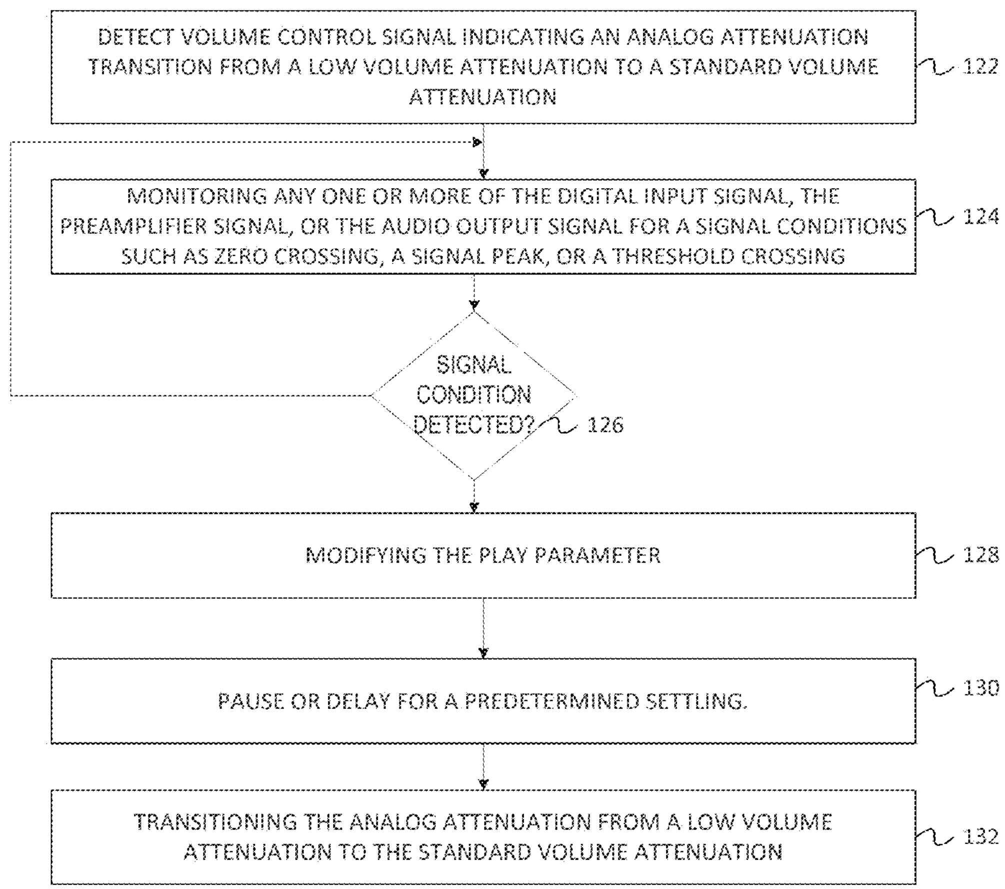

In at least one embodiment, the playback control state machine 50 may include or support signal and state transition procedures to reduce audible artifacts including audible pops and clicks that might otherwise occur unabated in the absence of the transition procedure. Audible pops and clicks may be attributable to large transients or spikes that may occur when discontinuities of voltage and/or current occur following a stage change. Referring now to FIG. 5A and FIG. 5B, an embodiment of an example transition method 100 is depicted. In the method 100 depicted in FIG. 5A, the playback control state machine 50 determines how best to transition from one playback state to another. In some embodiments, the transition procedures may be invoked or otherwise executed when a volume control signal indicates that an analog gain of the power amplifier will transition to a low volume state in which the analog attenuation is lower than an attenuation threshold such as −20 dB, as an example. In some embodiments, as discussed above with respect to FIG. 3, the transition to a low volume state may permit modification to one or more playback parameters to achieve a goal such as reduced power consumption or improved dynamic range. The change in state and the accompanying changes in the analog attenuation and at least one playback parameter may produce unintended and undesirable current or voltage spikes that may produce audible and unpleasant noises including pops and clicks.

FIG. 5A illustrates a first part of a method 100 for transition of a playback path from a standard volume playback state to a low volume playback state and vice versa. The part of method 100 depicted in FIG. 5A corresponds to a standard volume to low volume transition of the analog gain signal and an accompanying change in one or more playback parameters. Like FIG. 4, method 100 may represent a method performed by playback controller 18 and/or playback control state machine 50.

The embodiment of transition method 100 depicted in FIG. 5A includes detecting (block 102) the volume control signal indicating a transition of the analog attenuation transition from a standard attenuation to a low volume attenuation. The method 100 illustrated in FIG. 5A may further include monitoring (block 104) any one or more of various playback path signals including the audio input signal, the preamplifier signal, or the audio output signal for a specific condition of the playback path signal. In at least one embodiment, the signal may be monitored in search of a zero crossing, a signal peak, or a threshold crossing. Upon detecting (block 106) the specific condition of the playback signal, the depicted embodiment of method 100 may transition (block 108) the analog attenuation from a standard volume attenuation to the low volume attenuation. Following the analog attenuation transition, a pause or is imposed at block 110, following which the playback parameter may be modified (block 112). A duration of the pause may reflect a setting period or a predetermined settling duration associated with the playback path. In some embodiments, the particular condition checked for in block 106 may be determined based at least in part on the playback parameter that is being modified.

Referring now to FIG. 5B, a second portion of method 100, analogous to the portion of method 100 depicted in FIG. 5A, is illustrated. FIG. 5B corresponds to example transition procedures that may be performed on a low to high transition, i.e., a transition of the analog gain from a low volume analog gain to a standard volume gain. As depicted in FIG. 5B, method 100 includes detecting (block 122) the volume control signal indicating an analog attenuation transition from a low volume attenuation to a standard attenuation and monitoring (block 124) one or more of the audio input signals, the preamplifier signal, or the audio output signal for a signal condition such as a zero crossing, a signal peak, or a threshold crossing. Responsive to detecting (block 126) the signal condition, the playback parameter may be modified (block 128) before imposing a pause or delay (block 130). After completion of a settling period, the analog attenuation may be transitioned (block 132) from a low volume attenuation to a low volume attenuation.

In the embodiments of transition method 100 depicted in FIG. 5A and FIG. 5B, it may be preferable to order the playback parameter modification relative to the modification of the analog attenuation to ensure that the playback parameter is modified at low analog gain before modifying the analog gain. Depending on the playback parameter being changed, the analog gain may be modified based on a signal condition that best identifies when a state change may occur most quietly. Playback parameters that tend to modify a phase of the playback path signal may be suitable for modifying at a peak value while parameter changes occurring after a transition to the low volume state may be performed.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An audio apparatus, comprising:

a playback path including:

a digital modulator configured to receive a playback signal corresponding to playback audio data and generate a digital audio signal in accordance with the playback audio data, wherein the digital modulator includes a sampling rate converter;

a digital-to-analog converter configured to receive an audio input signal and generate an analog preamplifier signal; and a selectable gain power amplifier configured to generate an audio output signal in accordance with:

the preamplifier signal; and an analog attenuation determined by an analog attenuation signal;

a volume control input to receive a volume control signal; and a playback controller configured to perform operations including:

generating the analog attenuation signal in accordance with the volume control signal;

monitoring a playback state, indicated by a plurality of playback parameters, for satisfaction of a playback criterion and responsive to detecting the playback state satisfying the playback criterion:

monitoring an audio signal selected from: the audio input signal, the preamplifier signal, and the audio output signal for a signal condition selected from a zero crossing, a signal peak, and a threshold crossing; and responsive to detecting the signal condition, modifying a playback parameter to improve a performance parameter of the playback path, wherein modifying the playback parameter comprises at least one of reducing a switching frequency of the sampling rate converter and reducing a sampling rate of the digital-to-analog converter.

2. The audio apparatus of claim 1, wherein the performance parameter is indicative of a cumulative power consumption of the playback path and wherein modifying the playback parameter produces a decrease in the cumulative power consumption.

3. The audio apparatus of claim 2, wherein the playback criterion comprises a low volume criterion, wherein the low volume criterion is met when the volume control signal indicates an analog gain of less than an attenuation threshold.

4. The audio apparatus of claim 3, wherein modifying the playback parameter includes:

modifying the playback parameter from a standard value to a low volume value responsive to the volume control signal indicating a low volume transition comprising a transition of the analog attenuation from an initial attenuation greater than an attenuation threshold to a modified value less than the attenuation threshold; and restoring the playback parameter to the standard value responsive to the volume control signal indicating a low-to-high transition of the analog attenuation from a low volume attenuation below the attenuation threshold to a standard volume value greater than the attenuation threshold.

5. The audio apparatus of claim 4, wherein modifying the playback parameter includes:

responsive to detecting the volume control signal indicating the low volume transition, monitoring an audio signal selected from: the audio input signal, the preamplifier signal, and the audio output signal for a signal condition selected from a zero crossing, a signal peak, and a threshold crossing;

responsive to detecting the signal condition, transitioning the analog attenuation from a standard volume attenuation to the low volume attenuation;

pausing for a predetermined settling duration following the transitioning of the analog attenuation; and following the predetermined settling duration, modifying the playback parameter.

6. The audio apparatus of claim 5, wherein modifying the playback parameter comprises modifying the playback parameter in incremental stages.

7. The audio apparatus of claim 5, wherein restoring the playback parameter includes:

responsive to detecting the volume control indicating the low-to-high transition, monitoring an audio signal selected from: the audio input signal, the preamplifier signal, and the audio output signal for a signal condition selected from a zero crossing, a signal peak, and a threshold crossing;

responsive to detecting the signal condition, modifying the playback parameter from the low volume value to the standard volume value;

pausing for a predetermined settling duration following the modification of the playback parameter; and following the settling duration, modifying the playback parameter.

8. The audio apparatus of claim 3, wherein the attenuation threshold is approximately −20 dB.

9. The audio apparatus of claim 3, wherein modifying the playback parameter increases a quantization noise of the digital modulator.

10. The audio apparatus of claim 3, wherein modifying the playback parameter increases a thermal noise of the digital-to-analog converter.

11. The audio apparatus of claim 3, wherein the digital-to-analog converter includes a delta sigma modulator and wherein the playback parameter comprises a delta sigma modulator parameter.

12. The audio apparatus of claim 11, wherein modifying the playback parameter comprises reducing a sampling rate of the delta sigma modulator.

13. The audio apparatus of claim 11, wherein the delta sigma modulator includes multiple stages and wherein modifying the playback parameter comprises bypassing at least one of the multiple stages.

14. The audio apparatus of claim 3, wherein modifying the playback parameter increases a G-proportional noise component of the playback path without increasing a 1+G noise component of the playback path.

15. The audio apparatus of claim 14, further comprising, modifying a second playback parameter to decrease the 1+G noise parameter, wherein a power consumption increase attributable to the 1+G noise parameter decrease is less than the decrease in cumulative power consumption.

16. The audio apparatus of claim 2, wherein the preamplifier signal is a differential signal including a common mode component and a signal component, wherein the low amplitude criteria are satisfied when an amplitude of the preamplifier signal is less than an amplitude threshold.

17. The audio apparatus of claim 16, wherein the playback parameter is the common mode component, and wherein modifying the playback parameter comprises reducing a magnitude of the common mode component.

18. The audio apparatus of claim 17, wherein modifying the selected parameter further includes at least one of: modifying a reference voltage of a reference input of the power amplifier in accordance with the reducing of the common mode component magnitude, increasing a resistance of at least one power amplifier resistor connected to a signal input of the power amplifier to lower a level shifting current provided by the digital-to-analog converter, and increasing a resistance of at least one of the power amplifier resistors proportional to the reduction of the common mode component.

19. The audio apparatus of claim 1, wherein the performance parameter is indicative of a total noise floor of the playback path and wherein modifying the playback parameter includes reducing the total noise floor.

20. The audio apparatus of claim 19, wherein reducing the total noise floor includes reducing a 1+G dependent noise component.

21. The audio apparatus of claim 20, wherein the low amplitude criterion is met when an amplitude of the preamplifier signal is less than an amplitude threshold.

22. The audio apparatus of claim 21, wherein reducing the 1+G dependent noise component comprises increasing a digital gain associated with a gain stage of the digital-to-analog converter and decreasing the analog gain in accordance with the increase of the digital gain.

23. A method comprising:

monitoring a playback path of an audio device that receives a digital playback signal corresponding to playback audio data and generates an analog audio output signal in accordance with the playback audio data, wherein the playback path has a selectable gain power amplifier that provides an analog attenuation and wherein the audio output signal is generated in accordance with the analog attenuation determined by an analog attenuation control signal;

receiving, by the playback path, a volume control signal;

generating the analog attenuation control signal in accordance with the volume control signal;

monitoring a playback state, indicated by a plurality of playback parameters, for satisfaction of a playback criterion; and responsive to detecting the playback state satisfying the playback criterion:

monitoring an audio signal selected from: an audio input signal, a preamplifier signal, and the audio output signal for a signal condition selected from a zero crossing, a signal peak, and a threshold crossing; and responsive to detecting the signal condition, modifying a playback parameter to improve a performance parameter of the playback path, wherein modifying the playback parameter comprises at least one of reducing a switching frequency of a sampling rate converter of the playback path and reducing a sampling rate of a digital-to-analog converter of the playback path.

24. The method of claim 23, wherein modifying the at least one playback parameter may degrade at least one performance parameter selected from:

a signal to noise ratio of the digital-to-analog converter; and a settling time of an analog amplifier of the digital-to-analog converter.

25. The method of claim 23, wherein modifying the at least one playback parameter may include modifying a playback parameter associated with the digital-to-analog converter.

26. The method of claim 25, wherein the playback parameter comprises a parameter selected from the group consisting of:

a sampling frequency;

an input stage gain;

a common mode voltage of the preamplifier signal;

a number of delta sigma stages in a modulator of the DAC; and a level shifting current from an output of the DAC to an output of the power amplifier.

27. The method of claim 25, wherein modifying the playback parameter may include:

controlling a transition of the analog attenuation based on an amplitude of the audio input signal; and controlling the transition of the analog attenuation transition relative to the modifying of the playback parameter.

28. The method of claim 27, wherein the modifying of the at least one playback parameter occurs after transitioning the analog attenuation to below the attenuation threshold.

29. The method of claim 28, wherein transitioning the analog attenuation is synchronized with an occurrence of a selected amplitude of the audio input signal, the selected amplitude being selected from the group consisting of: a zero amplitude, a peak amplitude, and predetermined threshold amplitude.

30. The method of claim 23, wherein the performance parameter is selected from:

a cumulative power consumption of the playback path; and a signal-to-noise ratio of the audio output signal.

31. An audio integrated circuit, comprising:

an audio playback path configured to receive a digitally encoded playback signal and generate an analog output signal in accordance with the playback signal, wherein the analog output signal includes an output noise component;

an audio volume input configured to receive a volume control signal from an audio volume control; and an audio output configured to provide the audio output signal to an acoustic transducer;

wherein the audio IC is configured to performing operations comprising:

monitoring a playback state of the playback path indicated by a plurality of playback parameters, for satisfaction of a playback criterion;

responsive to detecting the playback state satisfying the playback criterion:

monitoring an audio signal selected from: an audio input signal, a preamplifier signal, and the audio output signal for a signal condition selected from a zero crossing, a signal peak, and a threshold crossing; and responsive to detecting the signal condition, modifying a configuration of the audio playback path, wherein modifying the playback parameter comprises at least one of reducing a switching frequency of a sampling rate converter of the playback path and reducing a sampling rate of a digital-to-analog converter of the playback path.

32. The audio integrated circuit of claim 31, wherein modifying the configuration of the audio playback path comprises modifying a configuration of a second playback path component, wherein the second playback path component is different than the first component.

33. The audio integrated circuit of claim 32, wherein the noise attributable to the first playback path component is proportional to 1+G and the noise attributable to the second playback path is proportional to G, where G indicates an analog attenuation of a power amplifier in the playback path.

34. The audio integrated circuit of claim 32, wherein the modifying of the second playback path component increases a noise attributable to the second playback path component.

35. The audio integrated circuit of claim 32, wherein the modifying of the second playback path component decreases a power consumption of the playback path.

36. The audio integrated circuit of claim 35, wherein the first playback path component comprises a power amplifier driving the audio output signal and the second playback path component is selected from the group consisting of:

a digital modulator configured to receive a playback signal containing playback content and generate an audio input signal; and a digital-to-analog converter configured to generate an analog preamplifier signal in accordance with the audio input signal and provide the analog preamplifier signal to the power amplifier.

37. The audio integrated circuit of claim 36, wherein modifying of the second playback path component comprises modifying a playback parameter selected from:

a sampling frequency of the digital modulator;

an order of a delta sigma modulator in the digital-to-analog converter;

a digital gain associated with a gain stage of the digital-to-analog converter;

a common mode voltage produced by the digital-to-analog converter;

a level shifting current from the digital-to-analog converter to an output of the power amplifier; and an impedance of at least one resistor coupled to the power amplifier.

38. An audio apparatus, comprising:

a playback path including:

a digital modulator configured to receive a playback signal corresponding to playback audio data and generate a digital audio signal in accordance with the playback audio data;

a digital-to-analog converter configured to receive an audio input signal and generate an analog preamplifier signal; and a selectable gain power amplifier configured to generate an audio output signal in accordance with:

the preamplifier signal; and an analog attenuation determined by an analog attenuation signal;

a volume control input to receive a volume control signal; and a playback controller configured to perform operations including:

generating the analog attenuation signal in accordance with the volume control signal;

monitoring a playback state, indicated by a plurality of playback parameters, for satisfaction of a playback criterion; and responsive to detecting the playback state satisfying the playback criterion:

monitoring an audio signal selected from: the audio input signal, the preamplifier signal, and the audio output signal for a signal condition selected from a zero crossing, a signal peak, and a threshold crossing; and responsive to detecting the signal condition, modifying a playback parameter to improve a performance parameter of the playback path, wherein modifying the playback parameter comprises at least one of increasing a G-proportional noise component of the playback path without increasing a 1+G noise component of the playback path, and reducing a magnitude of a common mode component of the preamplifier signal where the preamplifier signal is a differential signal including the common mode component and a signal component.

39. The audio apparatus of claim 38, further comprising, modifying a second playback parameter to decrease the 1+G noise parameter, wherein a power consumption increase attributable to the 1+G noise parameter decrease is less than the decrease in cumulative power consumption.

40. The audio apparatus of claim 38, wherein the preamplifier signal is a differential signal including the common mode component and the signal component, and the playback criterion comprises a low amplitude criteria, wherein the low amplitude criteria are satisfied when an amplitude of the preamplifier signal is less than an amplitude threshold.

41. The audio apparatus of claim 40, wherein the playback parameter is the common mode component, and wherein modifying the playback parameter comprises reducing a magnitude of the common mode component.

42. The audio apparatus of claim 41, wherein modifying the selected parameter further includes at least one of: modifying a reference voltage of a reference input of the power amplifier in accordance with the reducing of the common mode component magnitude, increasing a resistance of at least one power amplifier resistor connected to a signal input of the power amplifier to lower a level shifting current provided by the digital-to-analog converter, and increasing a resistance of at least one of the power amplifier resistors proportional to the reduction of the common mode component.

43. The audio apparatus of claim 38, wherein the performance parameter is indicative of a total noise floor of the playback path.

44. The audio apparatus of claim 43, wherein the playback criterion comprises a low amplitude criterion, wherein the low amplitude criterion is met when an amplitude of the preamplifier signal is less than an amplitude threshold.

45. The audio apparatus of claim 44, wherein reducing the 1+G dependent noise component comprises increasing a digital gain associated with a gain stage of the digital-to-analog converter and decreasing the analog gain in accordance with the increase of the digital gain.

46. A method comprising:

monitoring a playback path of an audio device that receives a digital playback signal corresponding to playback audio data and generates an analog audio output signal in accordance with the playback audio data, wherein the playback path has a selectable gain power amplifier that provides an analog attenuation and wherein the audio output signal is generated in accordance with the analog attenuation determined by an analog attenuation control signal;

receiving, by the playback path, a volume control signal;

generating the analog attenuation control signal in accordance with the volume control signal;

monitoring a playback state, indicated by a plurality of playback parameters, for satisfaction of a playback criterion; and responsive to detecting the playback state satisfying the playback criterion:

monitoring an audio signal selected from: an audio input signal, a preamplifier signal, and the audio output signal for a signal condition selected from a zero crossing, a signal peak, and a threshold crossing; and responsive to detecting the signal condition, modifying a playback parameter to improve a performance parameter of the playback path, wherein modifying the playback parameter comprises at least one of increasing a G-proportional noise component of the playback path without increasing a 1+G noise component of the playback path, and reducing a magnitude of a common mode component of the preamplifier signal where the preamplifier signal is a differential signal including the common mode component and a signal component.

47. An audio integrated circuit, comprising:

an audio playback path configured to receive a digitally encoded playback signal and generate an analog output signal in accordance with the playback signal, wherein the analog output signal includes an output noise component;

an audio volume input configured to receive a volume control signal from an audio volume control; and an audio output configured to provide the audio output signal to an acoustic transducer;

wherein the audio IC is configured to performing operations comprising:

monitoring a playback state of the playback path indicated by a plurality of playback parameters, for satisfaction of a playback criterion;

responsive to detecting the playback state satisfying the playback criterion:

monitoring an audio signal selected from: an audio input signal, a preamplifier signal, and the audio output signal for a signal condition selected from a zero crossing, a signal peak, and a threshold crossing; and responsive to detecting the signal condition, modifying a configuration of the audio playback path, wherein modifying the playback parameter comprises at least one of increasing a G-proportional noise component of the playback path without increasing a 1+G noise component of the playback path, and reducing a magnitude of a common mode component of the preamplifier signal where the preamplifier signal is a differential signal including the common mode component and a signal component.

* * * * *